United States Patent [19]

Collier et al.

[11] 4,071,367

[45] Jan. 31, 1978

[54] CHANNELED PHOTOSENSITIVE ELEMENT

[75] Inventors: John R. Collier, The Plains, Ohio; Yvan P. Pilette, Lawrenceville, N.J.

[73] Assignee: E. I. Du Pont de Nemours and Company, Wilmington, Del.

[21] Appl. No.: 678,931

[22] Filed: Apr. 21, 1976

Related U.S. Application Data

[62] Division of Ser. No. 527,840, Nov. 27, 1974, Pat. No. 3,984,244.

[51] Int. Cl.$^2$ .............................................. G03C 1/72
[52] U.S. Cl. ...................................... 96/79; 96/36.2; 96/87 R
[58] Field of Search .................. 96/36, 36.2, 38.3, 79, 96/27 R, 87 R

[56] References Cited

U.S. PATENT DOCUMENTS

| | | | |
|---|---|---|---|
| 3,535,157 | 10/1970 | Steinhoff et al. | 96/36.2 UX |
| 3,563,743 | 2/1971 | Cook | 96/38.3 X |
| 3,732,363 | 5/1973 | Glenn | 96/79 UX |
| 3,891,443 | 6/1975 | Halpern et al. | 96/79 |
| 3,944,420 | 3/1976 | Gale | 96/38.3 |

*Primary Examiner*—Edward C. Kimlin

[57] ABSTRACT

A channeled photosensitive element is described. In particular, the element has a substantially solid photosensitive, thermoplastic layer having grooves or channels therein, the layer being applied with pressure to a surface, e.g., having raised areas such as in a printed circuit board without entrapping air bubbles.

3 Claims, 7 Drawing Figures

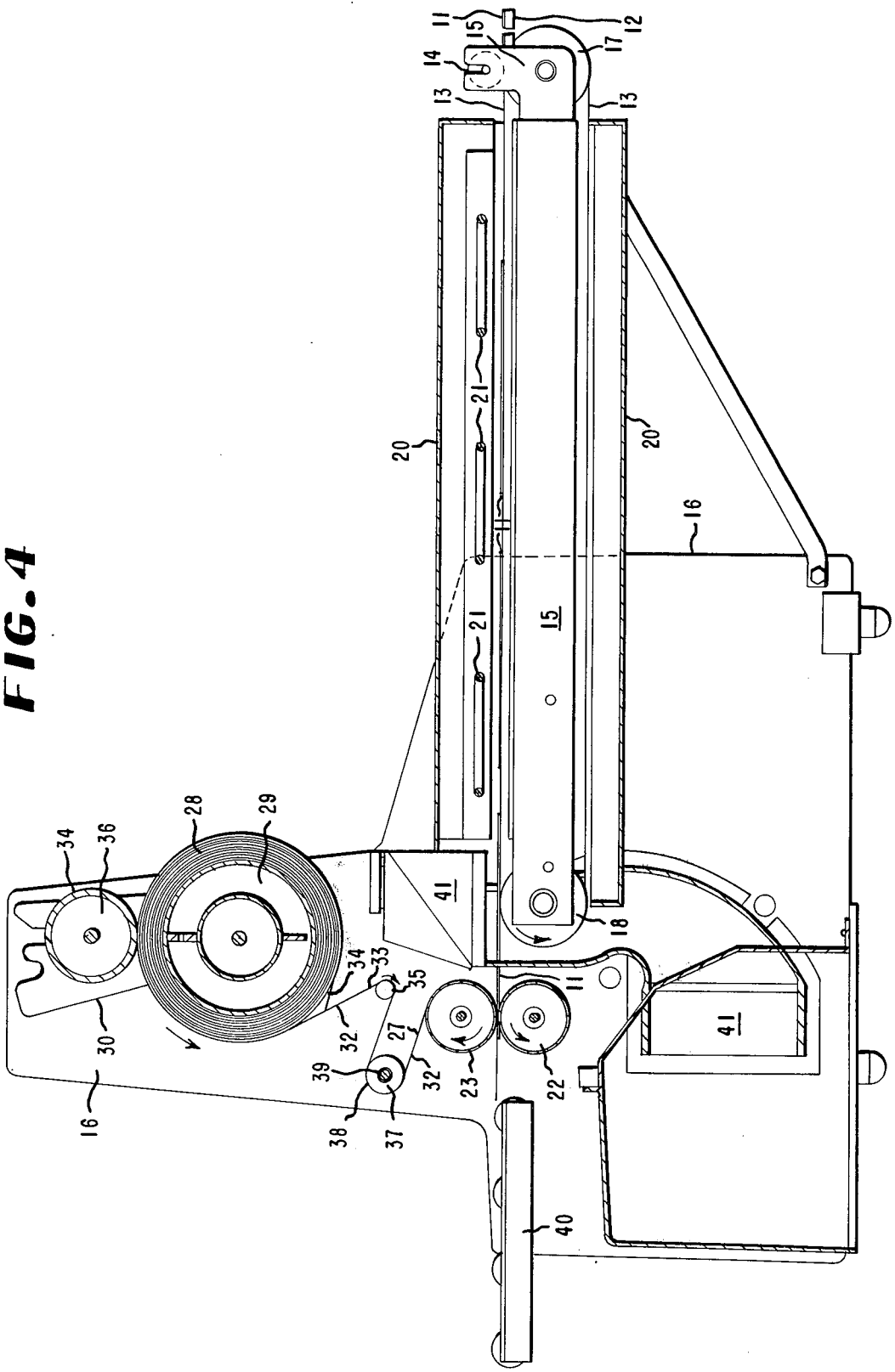

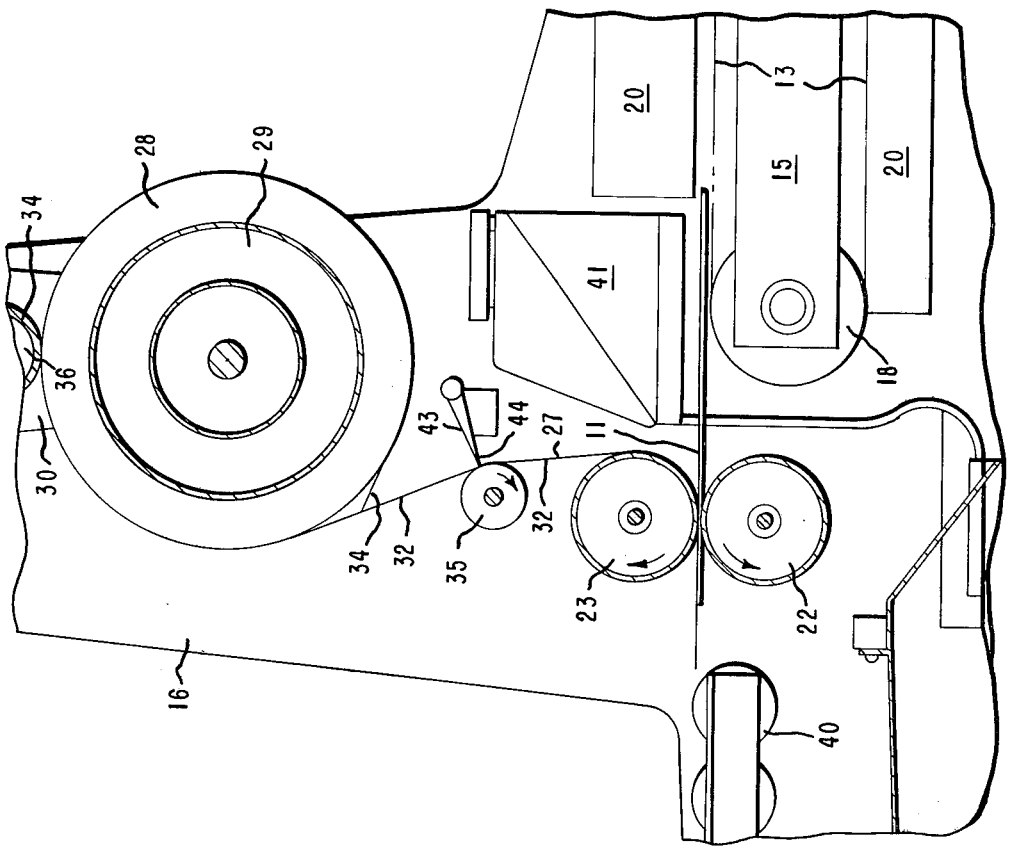
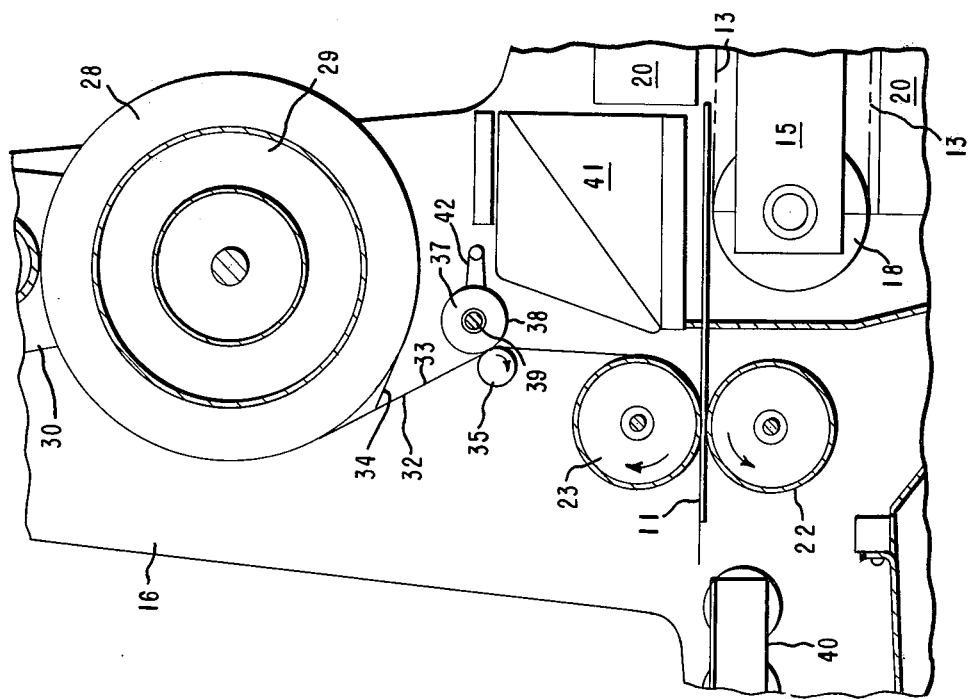

CHANNELED PHOTOSENSITIVE ELEMENT

This is a division of application Ser. No. 527,840, filed Nov. 27, 1974, now U.S. Pat. No. 3,984,244.

BACKGROUND OF THE INVENTION

1. Field of the Invention

This invention relates to printed circuit boards. More particularly, this invention relates to protective encapsulation of printed circuit boards. Still more particularly, this invention relates to the application of dry film photosensitive solder mask to printed circuit boards and its use.

2. Description of the Prior Art

The application of liquid or dry film resist materials to smooth surfaced elements is well known. However, when it is desirable to apply a resist material to a surface having raised discontinuities, e.g., a solder mask or gold tab resist to a printed circuit board, simple lamination methods generally result in poor conformation of the resist around the raised discontinuities.

A solder mask is a protective coating which is selectively applied to portions of a printed circuit board surface to confine solder to pad areas on the board and to prevent bridging between conductors during tinning operations and during soldering of components. A solder mask also functions to prevent or minimize corrosion of the bare copper conductors and as a dielectric to insulate certain components from adjacent circuitry. Since a solder mask remains on the finished circuit board, it usually is transparent to allow for ease of circuit inspection.

A solder mask is conventionally applied as a curable ink by screen printing techniques. However, screen printing over raised circuitry on a circuit board poses several problems particularly when circuit density is high and the board is large. The curable ink must flow; yet if too much flow occurs, there is "shadowing", or flow, of the ink into holes and into areas intended to be open. Misregistration can also result in a conductor adjacent to a pad being left open with subsequent bridging of solder in the tinning operation or in soldering components.

The problems of the screen printing technique can be overcome by the use of dry, photosensitive, resist film similar to those disclosed in Celeste, U.S. Pat. No. 3,469,982, Celeste, U.S. Pat. No. 3,526,504, and French Pat. No. 7211658 as a solder mask using the process described in the aforementioned U.S. Pat. No. 3,469,982 or apparatus similar to that in Heiart, U.S. Pat. No. 3,404,057 and Cohen et al., U.S. Pat. No. 3,547,730. Another advantage of the photosensitive, dry film, solder mask lamination technique over the screen printing technique is the reduced time and ease of preparation of the masked circuit boards, since protracted curing times at elevated temperatures are avoided. The major drawback of the dry film lamination method is the inability of the film to conform around all of the raised circuitry. In particular, when a circuit board is laminated with a dry film at elevated temperatures, raised circuit components which are perpendicular to the direction of lamination are "tented" over, thereby entrapping air between the board and the mask. Such entrapped air results in poor adhesion of mask to board, blistering of the mask during tinning and soldering procedures, and loss of circuit definition when the circuit itself consists of a low melting conductor such as solder.

Similar conformation problems arise when a dry photosensitive resist film is used as a gold tab resist. A gold tab resist material is used during the manufacture of circuit boards to isolate the connector tab region of the board, so that the exposed connector contact elements of the board can be plated with gold. The tab, with gold plated contact elements thereon, then forms the electrical connector for the completed circuit board with soldered components thereon. Gold tab resist is currently applied manually as a specialized adhesive tape to all areas of a circuit board except the tab regions. The operation is meticulous and the tape material by necessity must withstand etching and plating baths.

SUMMARY OF THE INVENTION

The invention relates to a photosensitive element comprising a photosensitive, thermoplastic layer having on one surface a plurality of channels with a depth of at least 0.0005 inch (0.00127 cm.) while the other surface has adhered thereto with low to moderate adherence a thin, flexible, polymeric film support.

The invention also includes a process of applying such a layer to a surface having raised areas comprising applying to said surface the channeled surface of the layer with pressure applied progressively across the film support in a direction substantially parallel to channels in the surface of the layer, whereby the layer is forced into intimate contact with the surface having raised areas. An additional process of the invention includes the step of forming channels in the photosensitive, thermoplastic film just prior to applying it to the surface, so that conventional photoresist films without channels may be used in the process.

A process of forming polymeric images on a surface having raised areas comprises, in addition to applying the layer as described above, the steps, in either order, or exposing the thermoplastic, photosensitive layer imagewise to actinic radiation and stripping the film support from the image-bearing layer; followed by modifying the image-bearing layer.

An apparatus of the invention for forming and applying such a layer to a surface having raised areas comprises means for forming channels in the surface of said layer and means for applying to said surface the channeled surface of the layer with pressure applied progressively across the film support in a direction substantially parallel to channels in the surface of the layer.

An apparatus particularly useful for preparing photoresist coated elements having a photosensitive layer adhered to a shaped article surface having raised areas or discontinuities, obtained from a photosensitive element having a photosensitive, thermoplastic layer arranged between a support and a protective cover layer, comprises:

1. means for feeding said photosensitive element to a channel-forming means;
2. a take-up means for removing said cover layer from said photosensitive element as the element is fed;
3. a channel-forming means for forming a plurality of channels in the coverless, photosensitive layer in the feed direction; and
4. pressure rolls for applying the grooved, coverless, photosensitive element to the shaped article surface having raised areas while pulling the channeled, coverless, element and the shaped article substantially in the direction of the grooves or channels therein through the pressure rolls.

In the apparatus described, the grooving means may be any device which forms a plurality of deep, closely spaced channels in the surface of the photosensitive layer in the direction the layer is being fed. A preferred grooving means is a free moving, heated roll having closely spaced, V-shaped grooves disposed circumferentially thereon, e.g., a threaded, heated roll with a V-shaped groove running helically along the length of the roll. In this instance, the photosensitive layer is disposed over the grooved roll and is pressed into the grooves by tension applied to the support by the drive means.

The grooves may be straight, striated, curved or sinuous or irregular or somewhat discontinuous, i.e., having spaces between small areas such as dots, squares, diamonds, etc. The cross section of the grooves may vary and be curvilinear, U-shaped, V-shaped, etc. The grooves may intersect on the photosensitive surface to form gratings, grids or crisscross patterns. The grooves, however, must form a plurality of deep channels along the length of the photosensitive layer and in the general direction that lamination will take place. Although grooves and channels with shallower depths may be useful in specific instances, grooves and channels should generally be at least half as deep as the thickness of the photosensitive layer and/or the height of the surface discontinuities. Also to be useful, the channels must be closely spaced, the lower limit being determined by the thickness of the layer, by the depth of the channel, and the height, width, spacing, and direction of the surface discontinuities to be enveloped during lamination.

Also in the apparatus, any means may be used to feed and, if needed, heat the shaped articles with surface discontinuities. A preferred means for feeding and heating the shaped articles is a driven belt extending through an oven, one end of the driven belt being juxtaposed to and feeding heated shaped articles to the pressure roll means, the driven belt being actuated by the drive means.

The apparatus may also include a second set of components (1), (2), and (3) disposed to secure to the reverse side of the shaped article a second grooved, coverless, photosensitive layer at the same time the front side of the shaped article is being laminated with a grooved, coverless layer as described above. Thus, the apparatus may be used to simultaneously laminate photoresist layers to both sides of a heated printed circuit board having raised components on both sides.

The apparatus described above may be used separately or may comprise a component of an integrated automatic machine such as that described in Cohen et al, U.S. Pat. No. 3,547,730.

The photoresist-forming type of photosensitive layer, conventionally referred to as "dry film resist," is a layer of photosensitive material from which a resist image may be produced after imagewise exposure to actinic radiation by removal of areas of the layer. In the case of a negative-working material, the unexposed areas are removed and the exposed areas remain as the resist image. In the case of positive-working materials, the unexposed areas form the resist image.

The invention provides an economical technique for applying such layers to surfaces having raised areas, e.g., printed circuit boards for the electronics industry, without entrapping air bubbles between the layer and the surface.

BRIEF DESCRIPTION OF THE DRAWINGS

FIGS. 4, 5, and 6 are sectional views of apparatuses of the invention; and

DESCRIPTION OF THE PREFERRED EMBODIMENTS

Figure 1:
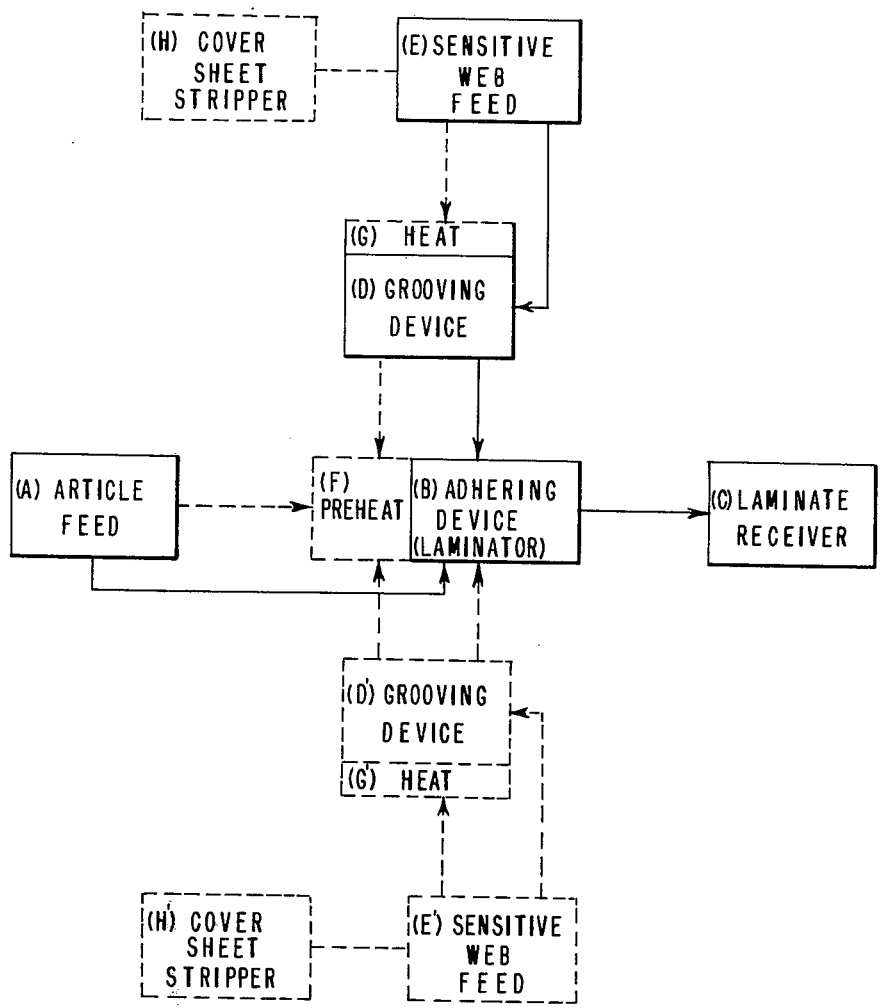
FIG. 1 is a flow sheet showing the function of the various parts of the machine of the invention.

The invention is particularly useful for forming a photoresist, e.g, a solder mask or a gold tab resist, on a surface having raised areas or discontinuities such as a circuit board surface having raised metallic circuit components, i.e., circuit lines, adhered thereto. The raised areas or discontinuities of the surface usually have a rectilinear cross section and angular edges, with an angular joint between the surface and the side walls of the raised areas thereon. In the preferred process of this invention for forming a photoresist on a circuit board from a photosensitive element having a thermoplastic, solid, photosensitive layer, e.g., photopolymerizable layer, arranged between a removable support and a protective cover layer, the cover layer is removed from the photosensitive layer and the photosensitive layer is grooved to produce a plurality of channels, e.g., about 20 to about 200 per inch (about 8 to 80 per cm.), with depth equivalent to the height of the raised circuit components, e.g., about 0.0005 to about 0.01 inch (about 0.0013 to about 0.025 cm.). A preferred method of grooving the photosensitive layer is by drawing the layer over a heated, free moving, threaded, round bar or roll with 100 thread per inch (~40 threads per cm.) and thread depth about 0.006 inch (~0.015 cm.). The grooved photosensitive layer adhered to the support is laminated to the circuit board surface by heating the board surface to about the softening temperature of the photosensitive layer or higher, applying the grooved layer to the hot circuit board surface, and passing the circuit board with grooved layer thereon between two resilient pressure rolls, substantially in the direction of the preformed channels. The pressure applied by the pressure rolls must be sufficient to compress the grooved layer to a continuous layer conforming to the raised circuit components. The magnitude of the applied pressure will of course depend on the nature of the photosensitive layer and the temperature involved in the lamination.

The invention provides a method whereby a photosensitive, thermoplastic layer is forced into intimate contact with a surface having raised areas with little or no entrapment of air bubbles. When forced into intimate contact with the surface, the air between the layer and surface escapes through the channels in the layer's surface and the layer deforms around and envelops the raised areas of the surface. It is preferred to apply the layer to the surface at or above the stick temperature of the layer so that deformation of the layer by the raised areas is facilitated and a firm bond between the layer and said surface is formed.

The laminated element comprises the printed circuit board, a continuous photosensitive layer adhered thereto, and adhered to the other surface of the layer with low to moderate adhesion, a removable support preferably transparent to actinic radiation. The photoresist layer is imagewise exposed to actinic radiation by placing a high-contrast transparency image over the transparent support in register with the circuit pattern of the circuit board and exposing the element conventionally to actinic radiation. In some instances, e.g., when the support is not transparent to actinic radiation or when particularly high resolution is required, the support may first be removed and the image bearing transparency placed directly on the photosensitive layer before exposure to actinic radiation.

The polymeric image in the exposed circuit board element can be modified and used in a number of ways. After the support is removed, the more soluble portions of the imaged layer may be washed away with an appropriate solvent to form a polymeric resist image on the surface of the circuit board. Similarly, in some instances exposed, or unexposed, portions of the image bearing layer can be removed along with the transparent support as the support is stripped away. In the above instances where the polymeric image bearing layer can be modified by imagewise removal of areas of the layer, the remaining polymeric image may be used as either a solder mask or a gold tab resist, or simply as a decorative or protective encapsulation. The exposed image bearing layer may also be modified by toning and plating techniques when the surface of the image bearing layer consists of tacky image areas or when image areas can be made tacky as, for instance, by heating. Thus, after removal of the film support from the exposed layer, the tacky image areas can be toned by dusting, or applying with pressure, colorants, pigments, magnetic particles, metallic particles, catalytic particles etc. When metallic or catalytic particles are used to tone the exposed layer, the image may be further modified by conventional electrolytic or electroless deposition of metal in the toned areas. Thus, by repeating the process of this invention, multiple circuits can be built up on a single board. Similarly, by toning with simple colorants and repeating the process as disclosed in Chu et al., U.S. Pat. No. 3,649,268 a circuit board can be encapsulated in a protective, decorative cover.

Any of a variety of methods may be used to prepare the grooved, photosensitive layer. A photosensitive layer may be drawn over a round, heated, grooved roll as described above or it may be embossed by a similar patterned pressure roll. The photosensitive layer may similarly be drawn over the teeth of a fixed, serrated bar. A photosensitive layer may be extruded from a die under conditions to give a patterned surface. In particular, an extrusion die could be provided with a plurality of teeth to form a grooved layer. The layer may be grooved just prior to lamination or it may be grooved and the element stored in rolls or sheets until used at a later time. To be useful as such a stored element, a comparatively hard or resilient photosensitive composition is generally required. A grooved layer may be prepared by coating a photosensitive composition on a grooved or patterned cover sheet and laminating the support film to the reverse smooth side of the photosensitive layer to form a photosensitive element. To use such a photosensitive element in the process of this invention, only the grooved cover sheet need be stripped away, leaving the grooved photosensitive layer exposed for use. A similar layer could also be prepared by extruding or laminating a photosensitive layer between a smooth support film and a grooved or patterned cover film. A grooved layer on a film support may also be prepared photographically by pre-exposing an element comprising a cover sheet, a photosensitive layer and a support film, through the coversheet and a grid or patterned transparency. To use such an element, the coversheet with the photohardened portions of the pre-exposed layers would be stripped from the remainder of the photosensitive layer which would then be used as described above.

The machine and process of this invention can be used with many types of photosensitive webs and/or layers including photopolymerizable webs or layers capable of addition polymerization and photocrosslinkable webs or layers. Many specific examples of such photohardenable layers are set forth in the following patents which are incorporated herein by reference: Celeste, U.S. Pat. No. 3,469,982; Celeste U.S. Pat. No. 3,526,504; French Pat. No. 7211658; and Hurley et al., U.S. Pat. No. 3,622,334.

In these particular cases, the unexposed areas remain soluble and are removed by the developing step. However, this machine and process may also be used with positive working films such as the photosoluble compositions disclosed in Roos, U.S. Pat. application Ser. No. 833,756, filed June 16, 1969, now U.S. Pat. No. 3,837,860 and the photodesensitizable compositions disclosed in Roos, U.S. Pat. No. 3,778,270. In both instances, exposed areas are removed to leave an image on the film. Actually, the basic requirement of the film is that imagewise exposure of the film either directly forms or can be rendered to form soluble and insoluble areas where further machine processing will remove the soluble areas, leaving an image on the film.

In practicing a preferred embodiment of the invention, an element containing an image-yielding photopolymerizable stratum is made by coating a layer of photopolymerizable composition on a suitable film support. After drying the photopolymerizable stratum, there is laminated to the surface thereof a removable cover film. The photopolymerizable composition is coated to give a dry coating thickness of about 0.0003 inch ($\sim$0.0008 cm.) to about 0.01 inch ($\sim$0.025 cm.) or more. A suitable support film which preferably has a high degree of dimensional stability to temperature changes, may be chosen from a wide variety of films composed of high polymers, e.g., polyamides, polyolefins, polyesters, vinyl polymers, and cellulose esters, and may have a thickness of from 0.00025 inch ($\sim$0.0006 cm.) to 0.008 inch ($\sim$0.02 cm.) or more. If exposure is to be made before removing the support film, it must, of course, transmit a substantial fraction of the actinic radiation incident upon it. If the support film is removed prior to exposure, no such restrictions apply. A particularly suitable film is a transparent polyethylene terephthalate film having a thickness of about 0.001 inch ($\sim$0.0025 cm.). Suitable removable cover films may be chosen from the same group of high polymer film described above and may have the same wide range of thicknesses. A cover film of 0.001 inch ($\sim$0.0025 cm.) thick polyethylene is especially suitable. Support and cover films as described above provide good protection to the photopolymerizable resist layer.

Photopolymerizable compositions for making the photosensitive element described above may comprise a wide variety of photopolymerizable compounds and suitable binders therefore. For example photopolymerization materials disclosed in Plambeck U.S. Pat. No. 2,760,863, Celeste, U.S. Pat. No. 3,469,982, French Pat.

No. 7211658; and Hurley et al. U.S. Pat. No. 3,622,334 are quite suitable as are novel polymerizable polymeric esters disclosed in Schoenthaler, U.S. Pat. No. 3,418,295.

In the above patents there are disclosed various suitable ethylenically unsaturated compounds, thermoplastic polymer binders, addition polymerization initiators activatable by actinic light and other constituents. Other suitable ethylenically unsaturated monomers are those disclosed in Burg et al., U.S. Pat. No. 3,060,023, Celeste U.S. Pat. No. 3,261,686, Celeste et al., U.S. Pat. No. 3,261,686 and Cohen et al. U.S. Pat. No. 3,380,831. In the case of the polymerizable polymers, no binders is necessary although a small amount may be used. In addition to photoinitiators, other ingredients such as plasticizers, thermal inhibitors, colorants, fillers, etc. also may be present as is well known in the art. As taught by the above references, some of the ingredients can act in a dual role. For example, in the monomer binder systems the ethylenically unsaturated photopolymerizable monomer can also act as a plasticizer for the thermoplastic binder.

Suitable binders which can be used as the sole binder or in combination with others include the following: Polyacrylate and alpha-alkyl polyacrylate esters, e.g., polymethyl methacrylate and polyethyl methacrylate; Polyvinyl esters, e.g., polyvinyl acetate, polyvinyl acetate/acrylate, polyvinyl acetate/methacrylate and hydrolyzed polyvinyl acetate; Ethylene/vinyl acetate copolymers; Polystyrenes; Vinylidene chloride copolymers, e.g., vinylidene chloride/acrylonitrile; vinylidene chloride/methacrylate and vinylidene chloride/vinyl acetate copolymers; Polyvinyl chloride and copolymers, e.g., polyvinyl chloride/acetate; Saturated and unsaturated polyurethanes; Synthetic rubbers, e.g., butadiene/acrylonitrile, acrylonitrile/butadiene/styrene, methacrylate/acrylonitrile/butadiene/styrene copolymers, 2-chlorobutadiene/1,3-polymers, chlorinated rubber, and styrene/butadiene/styrene, styrene/isoprene/styrene block copolymers; High molecular weight polyethylene oxides of polyglycols having average molecular weights from about 4,000 to 1,000,000; Epoxides, e.g., epoxides end capped with acrylates or methacrylates; Copolyesters, e.g., those prepared from the reaction product of a polymethylene glycol of the formula $HO(CH_2)nOH$, where $n$ is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; Nylons or polyamides, e.g., N-methoxymethyl polyhexamethylene adipamide; Cellulose esters, e.g., cellulose acetate, cellulose acetate succinate and cellulose acetate butyrate; Cellulose ethers, e.g., methyl cellulose, ethyl cellulose and benzyl cellulose, Polycarbonates; Polyvinyl acetal, e.g., polyvinyl butyral, polyvinyl formal; Polyformaldehydes.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, 2,2-di(p-hydroxyphenyl)-propane diacrylate, pentaerythritol tetraacrylate, 2,2-di(p-hydroxyphenyl)-propane dimethacrylate, triethylene glycol diacrylate, polyoxyethyl-2,2-di(p-hydroxyphenyl)propane dimethacrylate, triethylene glycol dimethacrylate, poloxypropyltrimethylol propane triacrylate (462), ethylene glycol dimethacrylate, butylene glycol dimethacrylate, 1,3-propanediol dimethacrylate, 1,2,4,butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5 pentanediol dimethacrylate, diallyl fumarate, styrene, 1,4 benzenediol dimethacrylate, 1,4-diisopropenyl benzene, and 1,3,5-triisopropenyl benzene.

In addition to the ethylenically unsaturated monomers mentioned above, the following free-radical initiated, chain-propagating, addition polymerizable, ethylenically unsaturated compounds having a molecular weight of at least 300 and which can be used with the above-described polymer compounds. These include, preferably, an alykylene or a polyalkylene glycol diacrylate prepared from an alkylene glycol of 2 to 15 carbons or a polyalkylene ether glycol of 1 to 10 ether linkages, and those disclosed in Martin et al., U.S. Pat. No. 2,927,022, issued Mar. 1, 1960, e.g., those having a plurality of addition polymerizable ethylenic linkages, particularly when present as terminal linkages, and especially those wherein at least one and preferably most of such linkages are conjugated with a double bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures.

A preferred class of free-radical generating addition polymerization initiators activatable by actinic light and thermally inactive at and below 185° C. includes the substituted or unsubstituted polynuclear quinones which are compounds having two intracyclic carbon atoms in a conjugated carbocyclic ring system. Suitable such initiators include 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in Plambeck U.S. Pat No. 2,760,863 and include vicinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc.; α-hydrocarbon substituted aromatic acyloins, including α-methylbenzoin, α-allylbenzoin and α-phenylbenzoin. In addition the photoreducible dyes and reducing agents disclosed in Oster U.S. Pat. Nos. 2,850,445; 2,875,047; 3,097,096; and Oster, et al. U.S. Pat. Nos. 3,074,974; 3,097,097, and 3,145,104 as well as dyes of the phenazine, oxazine, and quinone classes may be used. Other suitable polymerization initiators include Michler's Ketone, benzophenone, 2,4,5-triphenylimidazolyl dimers with hydrogen doners, and mixtures thereof as described in U.S. Pat. Nos. 3,427,161, 3,479,185 and 3,549,567.

Suitable thermal polymerization inhibitors that can be used in photopolymerizable compositions include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene. Other useful inhibitors include p-toluquinone and chloranil.

Various dyes may be added to increase the visibility of the resist image. Pigments may also be used in this capacity. Any colorant used, however should preferably be transparent to the actinic radiation used.

Referring to the drawings, and more particularly to FIG. 1, this figure shows, in schematic form, a diagram of essential features of the machine in solid lines and optional features of more complex embodiments in dotted lines. Essentially, the machine consists of an article feed means $a$ which takes the article from a supply provided thereof and conveys it to an adhering device $b$ where it is brought into contact by pressure with a grooved photosensitive layer of a substantially dry web of grooved photosensitive material to form a photosensitive laminate and feeding the laminate to a laminate receiver $c$, the web of grooved photosensitive material being fed from a grooving device $d$ that forms deep grooves or channels in the photosensitive layer of said web of photosensitive material, the grooves or channels being parallel to the direction the grooved layer is fed to the adhering device, the web of photosensitive material being fed to the grooving device of a photosensitive web feed means $e$.

In addition to the essential features described above optional forms of the machine may include any of the following: a preheater, $f$, through which the articles and/or the sensitized grooved web may be fed before they are fed to the laminating or adhering device; a heater $g$, which may be an integral part of the grooving device, over which or through which the photosensitive web is heated before or during grooving of the photosensitive layer; and a cover sheet stripper, $h$, for removal of a protective cover sheet from the surface of a photosensitive material before feeding it from $e$ to $g$ or $d$ when employing elements having such a structure. In one embodiment of the invention, plates or similar articles may be laminated on both sides. In this embodiment duplicate grooving device, $d'$; web feed, $e'$; heat means, $g'$; and cover sheet stripper, $h'$, are provided.

Figure 7:
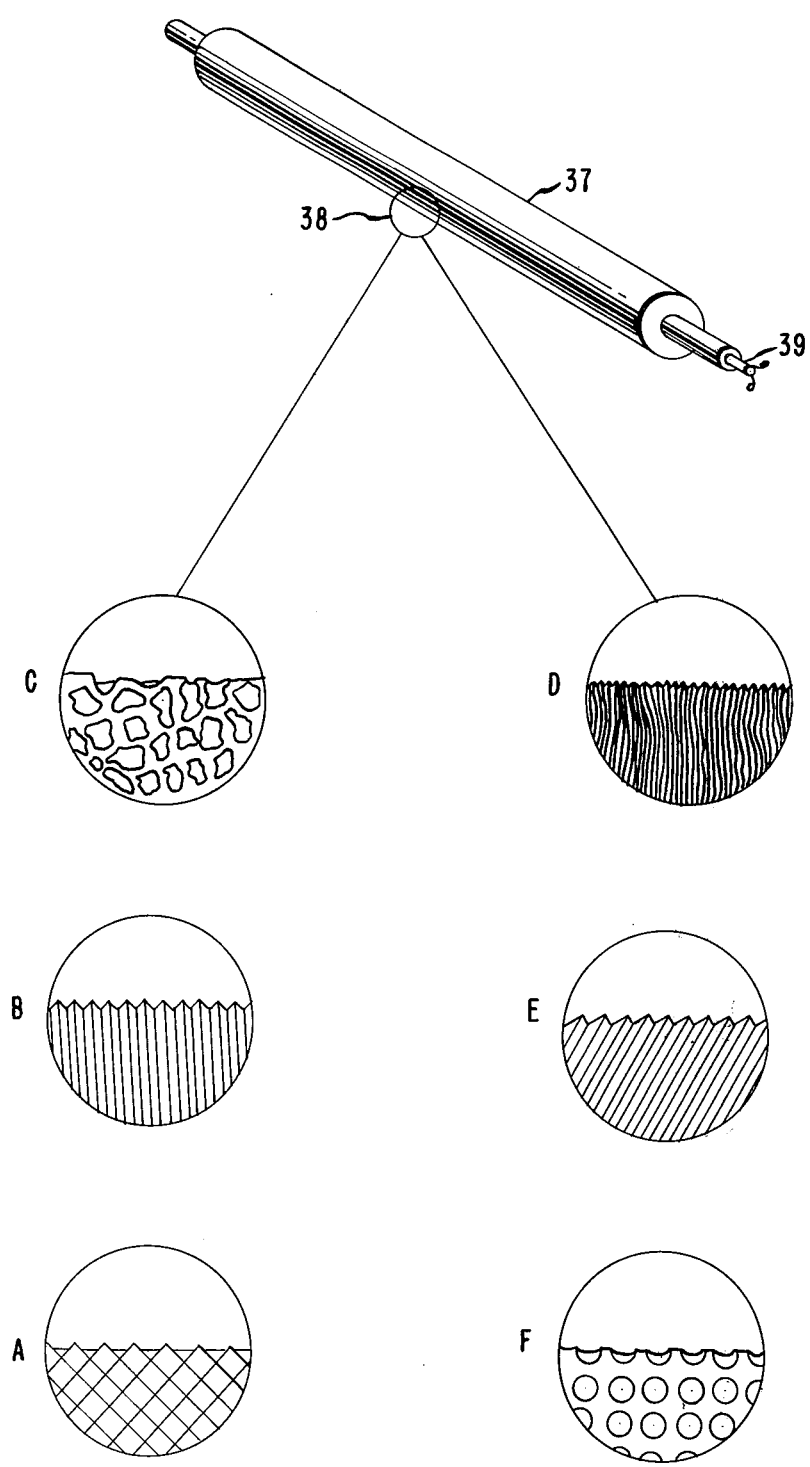
FIG. 7 is a series of views of useful grooved roll patterns.

A specific machine of the invention for applying photosensitive layer to the surface of a sheet or plate having raised discontinuities, e.g., applying a photoresist to a printed circuit board having raised circuit components is shown in FIG. 4. In this machine, circuit boards 11 are fed mechanically or manually from a table or platform 12 into the nip between a driven, continuous wire belt 13 and an idler roller 14 free to move vertically above the end of the wire belt 13 in slots of the belt support members 15 which are attached to the machine support members 16. The continuous wire belt 13 is fully extended and supported by an idler roller 17, firmly attached to the belt support members 15 below and parallel to idler roller 14, and by a driven roller 18 attached to the opposite ends of the belt support members 15. The driven roller 18 is driven by a chain-sprocket drive so that the upper belt portion carrying the circuit boards 11 travels toward the driven roller. A sheet metal heat shield 20 attached to the belt support members 15 enshrouds the driven continuous wire belt 13 between idler roller 17 and driven roller 18. Between and parallel to the top portion of the wire belt 13 and the heat shield 20 a glow bar, radiant heater 21 is attached to the heat shield 20. Thus circuit boards 11 are heated by radiant heat as they pass through the preheater on the wire conveyer belt 13 at a constant rate into the nip of the laminator. The laminator comprises two driven pressure rollers 22 and 23, each with a resilient outer surface having a Shore ®A hardness of about 65 and both driven through a single chain-sprocket mechanism by an electric motor. The position of a bottom pressure roller 22 is fixed between the machine support members 16 so that it is parallel to driven roller 18 of the conveyer belt preheat section, and so that its top surface is tangential to the plane formed by the upper belt portion of the continuous wire belt 13 carrying the circuit boards 11. Referring to FIG. 4, the bottom pressure roller 22 is driven in a counter clockwise direction and in turn drives the driven roller 18 through the chain sprocket drive at a rate so that the resulting wire belt feed velocity is equal to or less than the tangental velocity of the driven bottom pressure roller 22. The upper driven pressure roller 23 is positioned above and parallel to the bottom driven pressure roller 22, so that the plane defined by both driven pressure rollers is substantially perpendicular to the plane formed by the upper belt portion of the continuous wire belt 13. The upper driven pressure roller 23 is attached to a movable support member and moving mechanism which permits vertical fixed positioning of the upper driven pressure roller 23 to produce a desired nip gap and/or nip pressure on a circuit board 11 being laminated with a grooved photosensitive layer 27. Referring to FIG. 4, the upper pressure roller 23 is driven in a clockwise direction with a tangential velocity matched to that of the lower driven pressure roller 22. A roll of photosensitive web 28 is firmly held on a mandrel 29 which is supported above and parallel to the pressure rollers 22 and 23 in slots of the feed roll support member 30 which in turn are attached to the machine support members 16. The mandrel 29 is provided with a clutch mechanism to retard free rotation and unwinding of the roll of photosensitive web 28. The photosensitive web comprises, in order, a removable support 32, a photosensitive layer 33 and a strippable coversheet 34, with the removeable support 32 being the outer most component of the roll of photosensitive web. Referring to FIG. 4, the roll of photosensitive web is unwound in a counter clockwise direction around a free moving, idler roller 35 supported between and parallel to the upper driven pressure roller 23 and the mandrel 29, the free moving, idler roller being supported by the machine support members 16. The portion of the photosensitive web in contact with the idler roller 35 is the removable support 32. Between the roll of photosensitive web 28 and the idler roller 35, the coversheet 34 is stripped off, wound around the outer surface of the roll of photosensitive web 28 and referring to FIG. 4, reeled up on a take up roll 36 in a clockwise direction, the take up roll 36 being driven by contact with the outer portions of the roll of photosensitive web 28. The take up roll 36 is held in place above the roll of photosensitive web 28 by slot guides in the feed roll support members 30. After the photosensitive web is threaded around the free moving, idler roller, it is threaded in a counter clockwise direction around a free moving, heated, grooved roll 37 so that the photosensitive layer 33 is in contact with the grooved roll. The photosensitive layer is then threaded in a clockwise direction around the upper driven pressure roller 23 so that the support 32 is in contact with roller 23 and through the roller nip between the pressure rollers 23 and 22. The free moving, heated, grooved roll 37 is parallel to the upper pressure roll 23 and is attached to the machine support members 16 in a position latterally displaced toward the front of the machine from a plan defined by the axis of idler roller 35 and upper pressure roller 23. The grooved roll 37 is heated by a heater 39 in an annular well in the shaft of the grooved roll 37. The grooves 38 of the grooved roll 37 preferably are formed by threading a roll to give 100 threads per inch (~40 per cm.) 0.005 inches (~0.013 cm.) deep, however numerous variations of groove patterns are possible as illustrated in FIG. 7. As the photosensitive web is pulled through the nip of the pressure rollers 22 and 23, the photosensitive layer 33 is pulled over and pressed into the grooves 38 of the grooved roll 37 by the support 32 due to the tension applied to the support 32 by the retarding action of clutch mechanism on the mandrel 29 rotation. As a circuit board 11 passes through the nip of the pressure roller 22 and 23 along with the grooved photosensitive web, the grooved photosensitive material 27 is compressed between the support 32 and the surface of the circuit board 11 so as to conform completely to the surface and around the raised circuit components. After passing through the laminator rollers 22 and 23, the laminated circuit board passes onto a conveyor of parallel idler rollers 40. A powered exhaust vent 41 is provided to remove fumes generated during heating. Further operations can then be carried out on the laminated circuit board.

Alternate grooving means are illustrated in FIGS. 5 and 6. In the first variation, FIG. 5, the free moving heated, grooved roll 37 is positioned laterally to the rear of the machine from idler roller 35. The grooved roll 37 is parallel to the idler roller 35 and is attached to a movable frame 42 which is attached to the machine support members 16. The photosensitive web is threaded between the idler roller 35 and the grooved roll 37 so that the removable support 32 is in contact with the idler roller 35. By moving the grooved roll 37 sufficiently close to the idler roller 35, i.e., no closer than the thickness of the removable support 32 and no further than about the combined thickness of the support 32 and two thirds the thickness of the photosensitive layer 33, useful grooves are embossed into the photosensitive layer 33 as the photosensitive web is pulled through by the laminating rollers 22 and 23. A second variation, FIG. 6, is the same as FIG. 5, except that the free moving heated, grooved roll 37 is replaced by a fixed, heated serrated bar 43 having about 100 serrations or teeth 44 per inch (~40 per cm.). Other variations are apparent. For example, the idler roller 35 position may be movable instead of the grooved roll 37 or serrated bar 43 position. Also, the idler roller 35 may be heated instead of or in addition to the grooved roll 37 or serrated bar 43. Numerous other equivalent patterns may be used in addition to the ones described above. It is also apparent that the driven pressure rollers 22 and 23 may also be heated.

The invention will be illustrated by, but is not intended to be limited to, the following examples.

EXAMPLE 1

Figure 2:
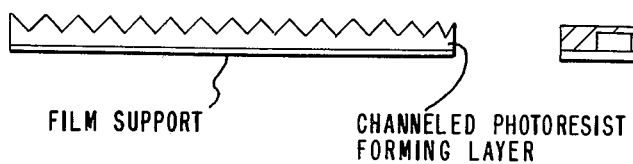
FIG. 2 is a cross section of a grooved photosensitive element.
Figure 3:
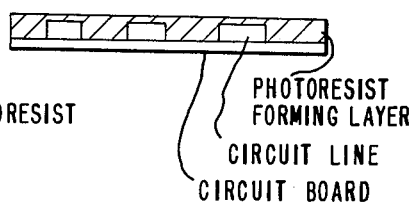
FIG. 3 is a cross section of a photosensitive layer applied to a circuit board with raised circuit lines.

Printed circuit boards having a plurality of raised circuit lines of various thickness are laminated with photopolymerizable resist-forming layers using the apparatus shown in the drawings, having a grooved roll. The photopolymerizable layers and elements are of the type described in U.S. Pat. No. 3,469,982. The element comprises a 0.004 inch (~0.01 cm.) thick photopolymerizable layer having on one surface a 0.001 inch (~0.0025 cm.) thick, flexible polyethylene terephthalate film support which is strippable from the layer, and on the other surface a 0.001 inch (~0.0025 cm.) thick strippable polyethylene cover sheet having less adhesion to the layer than the support has. The photopolymerizable layer, as earlier described, comprises an addition-polymerizable ethylenically unsaturated acrylic compound, a macromolecular polymeric binder, and a polymerization initiator activatable by actinic radiation. A rolled web of the photopolymerizable element is put on the mandrel 29 of the machine illustrated in FIG. 4, the cover sheet is removed, and the photosensitive layer is threaded over a grooved roll 37 of the type illustrated in FIG. 7B. The grooved roll 37 is heated to 140° F. (60° C.) and has 100 V-shaped grooves per inch (~40 per cm.), the groove depth being 0.005 inch (~0.013 cm.). The resulting grooved element has a cross section similar to that illustrated in FIG. 2. Circuit boards are fed consecutively into the preheater of the machine and reach a temperature of about 300° F. (150° C.) when they pass into the nip of the laminator rollers 22 and 23. The circuit boards pass through the laminator at a rate of 12 inches (~30.5 cm.) per minute in a direction substantially parallel to the grooves in the layer applied to them. The support is stripped from the photopolymerizable layer of each laminated circuit board, and each board is then visually inspected. Good conformation of the resist to circuit lines, i.e., raised circuit components, as illustrated in FIG. 3, without the entrapment of gross air bubbles along the edges of the circuit lines is obtained with circuit line dimensions as listed below:

| Circuit Line Thickness (inches × 10$^{-3}$) | Space Between Circuit Lines (inches × 10$^{-3}$) |
| --- | --- |
| 1.4 | 11.6 |
| 2.4 | 11.6 to 100 |
| 3.4 | " |
| 3.4 | " |
| 4.4 | " |
| 5.4 | " |

To compare the above lamination using a grooved, photopolymerizable layer with prior art lamination methods using a uniform, continuous, photopolymerizable layer, the photopolymerizable layer after the cover sheet has been removed is not threaded over the heated, grooved roll 37 as described above. Instead, the grooved roll is bypassed and the photopolymerizable element is fed directly into the nip of the laminator rollers 22 and 23 so that the uniform photopolymerizable layer comes directly in contact with heated circuit board surfaces having the same circuit line dimensions as listed above and laminated thereto. The support is then stripped from the layer which remains adhered to the board. Upon inspection of the bond between layer and board, gross air bubbles are visible around the edges of the circuit lines with dimensions as given above.

EXAMPLE 2

This example illustrates the preferred process of the invention for applying molten metal to a surface having raised areas. Printed circuit boards having a plurality of raised circuit lines are laminated with photosensitive elements comprised of a photosensitive, thermoplastic layer having on one surface a strippable polyethylene terephthalate film support. The photosensitive, thermoplastic layer is of the photoresist-forming type comprised of a photopolymerizable composition as described in Example 1 and is substantially free of components which would volatilize in the polymerized layer at temperatures reached in molten metal application. In each case, the photoresist-forming layer with adherent, strippable support is applied to a printed circuit board comprised of an epoxy-fiberglass board with copper circuit lines, by the process of the invention described in Example 1. The laminated board is then removed from the laminator and cooled to room temperature. The side of the photoresist-forming layer bearing the film support is then exposed to ultraviolet light in an image pattern through the support, and the support is then removed. Alternatively, the support could be removed prior to exposure. The unexposed areas are then removed by washing then away with a solvent which removes only the unexposed, unpolymerized areas and not the exposed, polymerized areas. Electrical components are then added to the board with their wire leads bent over the appropriate circuit lines in the areas from which the areas of resist has been removed.

The side of the board having the circuit lines is then coated with flux and wave soldered at 3.5 feet per minute with a commercial wave soldering machine with a preheat station at 66°–290° C. The solder is eutectic mixture of 63% tin and 37% lead. The solder pot also contains about 1–5% oil at 232°–260° C. After application of the solder, the board is cooled and cleaned in a solvent such as 1,1,1-trichloroethane. The photoresist can then be removed by brushing with a suitable solvent, or it can be left in place. By this procedure, solder connections can be made in desired areas of the board while the other areas remain protected by the photoresist.

EXAMPLE 3

A printed circuit board is laminated with a photopolymerizable layer as in Example 2, except that the grooved roll has 40 V-shaped grooves per inch (~16 per cm.) which are 0.006 inch deep (~0.015 cm.). The photopolymerizable layer is imagewise exposed through a transparency of a related printed circuit. The support is then stripped off, and the unexpected areas are toned or dusted with copper powder, e.g., as in Example III of U.S. Pat. No. 3,060,024, whereby the powder becomes embedded in the unexposed areas of the layer, and post-exposed to actinic radiation. The copper image is then electrolessly plated with copper by immersion for 14 hours in a conventional electroless plating bath. The resulting two layer printed circuit board is then laminated with a second photopolymerizable layer, imagewise exposed, and the unexposed areas removed as in Example 2. Electrical components are then added to the board and soldered as described in Example 2. By repeating the lamination, exposure, toning and plating steps, a multi-layered sandwich structured circuit board may be constructed.

EXAMPLE 4

This example demonstrates the use of this lamination technique for preparing gold-tab resists. Circuit boards having tab areas with gold plated, electrical contact components are prepared as follows. Circuit boards having circuit components comprised of copper plated with tin-lead solder are laminated with a grooved photopolymerizable layer as in Example 1 except that the grooved roll had 40 V shaped grooves per inch (~16 per cm.) 0.006 inches (~0.015 cm.) deep and the photopolymerizable layer has the composition described in Example 1 of U.S. Pat. No. 3,469,982. The side of the photoresist forming layer bearing the film support is then exposed to ultraviolet light through a transparency which masks the tab areas. The unexposed photopolymerizable material in the tab areas are removed by solvent wash as in Example 2. The solder is then removed from the tab areas by immersing the boards in a conventional solder etching bath. The boards are washed and then the exposed copper components are conventionally electroplated first with nickel followed by gold. The resist is then stripped from the boards as in Example 2 to give circuit boards with solder plated copper components with gold plated contact components on the connector tab. The circuit boards are then laminated with a solder mask and processed as in Example 2 to give a completed circuit board with soldered electrical components.

EXAMPLE 5

Circuit boards are laminated with channeled photopolymerizable layers as described in Example 1 except that the channels are embossed into the layer as illustrated in FIG. 5 and as hereinbefore described by using a heated embossing roll having a regular pattern of diamond-shaped wells as illustrated in FIG. 7A. The embossing roll is prepared from a smooth brass roll using conventional gravure etching methods and has 40 wells per inch (~16 per cm.) approximately 0.006 inch (~0.015 cm.) deep. The embossed photopolymerizable layer 27 has a corresponding diamondshaped, knurled surface which provides channels in a direction substantially parallel to the direction of the boards as they pass through the pressure rolls and from which air can escape during lamination. Good conformation of the resist layer to the circuit lines without the entrapment of gross air bubbles is obtained with boards having circuit line dimensions listed in Example 1.

EXAMPLE 6

A pre-grooved photopolymerizable element is prepared by coating a photopolymerizable composition of the type described in Example IV of U.S. Pat. No. 3,469,982, on a 0.001 inch (~0.0025 cm.) thick, flexible polyethylene terephthalate film web. The photosensitive layer is then grooved by a process similar to that described in Example 1, and the grooved surface is covered with a 0.001 inch (~0.0025 cm.) thick polyethylene cover sheet. The grooved photosensitive element is cut into sheets and stored until use. Circuit boards are laminated with the photosensitive layers by first removing the coversheet, placing the grooved photosensitive surface of the sheet in contact with the circuit containing surface of the circuit board and passing the composite through heated rolls of a conventional heated roll laminator of the type described in U.S. Pat. No. 3,404,057. Care is taken, so that the composite is passed through the laminator in the direction of the grooves in the grooved surface. When the circuit board is examined, it is found to be free of entrapped air bubbles around the circuit lines.

EXAMPLE 7

A 0.01 inch (~0.025 cm.) thick polyethylene film web is embossed with a heated knurled roll to produce a web having a pattern of irregular-shaped wells similar to those illustrated in FIG. 7C with about 30 wells per inch (~12 per cm.), about 0.005 inch (~0.013 cm.) deep. The patterned surface is coated with a photocrosslinkable composition of the type disclosed in Example 1 of U.S. Pat. No. 3,526,504; and when dried, the resulting smooth photocrosslinkable surface is laminated with a 0.001 inch (~0.0025 cm.) polyethylene terephthalate film. A roll of the photocrosslinkable element is placed on the mandrel 29 of the machine illustrated in FIG. 4.

The polyethylene cover sheet is removed as hereinbefore described exposing a knurled photocrosslinkable surface with channels therein. The grooved roll is bypassed and the channeled, photocrosslinkable element is fed directly into the nip of the laminator rollers 22 and 23 so that the knurled photocrosslinkable surface comes directly into contact with heated circuit board surfaces of boards fed through the preheater of the apparatus in the channel direction. After the polyethylene terephthalate film is removed from the laminated boards, they are visually inspected. Good conformation of the resist to circuit lines, without entrapment of gross air bubbles is obtained with circuit line dimensions listed in Example 1.

EXAMPLE 8

A circuit board of the type described in Example 4 is laminated with a photopolymerizable layer as in Example 2, and then exposed to ultraviolet light in an image pattern through the support leaving the tab areas among other areas unexposed. The strippable support is then selectively removed from only the tab areas which are washed away with solvent. The circuit board with the remaining support protected laminate thereon is treated in etching and plating baths as in Example 4. After the gold plating of the tab contacts is complete, the remaining film support is removed and the unexposed areas thereunder are removed by washing them away with a solvent. Electrical components are then added to the circuit board and soldered as in Example 2.

We claim:

1. A photohardenable, thermoplastic element comprising a photohardenable thermoplastic layer having a surface containing a plurality of channels with a depth of at least 0.0005 inch and at least half as deep as the thickness of the photohardenable layer while the other surface has adhered thereto with low to moderate adherence a thin, flexible, polymeric film support.

2. An element according to claim 1, wherein said channels are V-shaped grooves.

3. A photosensitive, thermoplastic element comprising a photopolymerizable layer comprised of an addition-polymerizable, ethylenically unsaturated compound, a macromolecular organic polymer binder, and a polymerization initiator activatable by actinic radiation, said layer having a surface containing a plurality of channels with a depth of at least 0.0005 inch and at least half as deep as the thickness of the photopolymerizable layer while the other surface has adhered thereto with low to moderate adherence a thin, flexible, polymeric film support.

* * * * *